(12) United States Patent
Zhong et al.

(10) Patent No.: US 9,680,038 B2
(45) Date of Patent: Jun. 13, 2017

(54) PHOTODETECTORS BASED ON DOUBLE LAYER HETEROSTRUCTURES

(71) Applicant: The Regents of The University of Michigan, Ann Arbor, MI (US)

(72) Inventors: Zhaohui Zhong, Ann Arbor, MI (US); Theodore B. Norris, Dexter, MI (US); Chang-Hua Liu, Ann Arbor, MI (US); You-Chia Chang, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 128 days.

(21) Appl. No.: 14/204,503

(22) Filed: Mar. 11, 2014

(65) Prior Publication Data

US 2014/0264275 A1      Sep. 18, 2014

Related U.S. Application Data

(60) Provisional application No. 61/778,716, filed on Mar. 13, 2013.

(51) Int. Cl.
  *H01L 31/028*   (2006.01)
  *H01L 31/032*   (2006.01)
  *H01L 31/0352*  (2006.01)
  *H01L 31/113*   (2006.01)

(52) U.S. Cl.
  CPC ........ *H01L 31/028* (2013.01); *H01L 31/0322* (2013.01); *H01L 31/035218* (2013.01); *H01L 31/1136* (2013.01); *Y02E 10/541* (2013.01); *Y02E 10/547* (2013.01)

(58) Field of Classification Search
  CPC ... H01L 31/0256; H01L 31/18; H01L 31/028; H01L 31/0322; H01L 31/1136; H01L 31/035218; Y02E 10/547; Y02E 10/541
  USPC ................. 257/21, 29, E31.003; 438/57
  See application file for complete search history.

(56) References Cited

U.S. PATENT DOCUMENTS

| | | |
|---|---|---|
| 6,627,914 B1 | 9/2003 | Komiyama et al. |
| 7,705,306 B2 | 4/2010 | Komiyama et al. |
| 8,053,782 B2 | 11/2011 | Avouris et al. |
| 8,143,648 B1 | 3/2012 | Moon |
| 2011/0042650 A1* | 2/2011 | Avouris et al. ............... 257/29 |
| 2012/0061647 A1 | 3/2012 | Komiyama et al. |
| 2012/0205518 A1* | 8/2012 | Voutilainen et al. ......... 250/200 |
| 2012/0241069 A1* | 9/2012 | Hofmann et al. ............. 156/60 |
| 2013/0032782 A1* | 2/2013 | Gerasimos et al. ........... 257/21 |

* cited by examiner

*Primary Examiner* — Fernando L Toledo
*Assistant Examiner* — Adam S Bowen
(74) *Attorney, Agent, or Firm* — Harness, Dickey & Pierce, PLC

(57) ABSTRACT

A photodetector is provided with a thin film double layer heterostructure. The photodetector is comprised of: a substrate; a channel layer of a transistor deposited onto a top surface of the substrate; a source layer of the transistor deposited on the top surface of the substrate; a drain layer of the transistor deposited on the top surface of the substrate, the source layer and the drain layer disposed on opposing sides of the channel layer; a barrier layer deposited onto the channel layer; and a light absorbing layer deposited on the barrier layer. The light absorbing layer is configured to absorb light and, in response to light incident on the light absorbing layer, electrical conductance of the channel layer is changed through hot carrier tunneling from the light absorbing layer to the channel layer.

16 Claims, 10 Drawing Sheets

Bottom Grahene  Top Grahene

Tunnel Barrier

PHOTODETECTORS BASED ON DOUBLE LAYER HETEROSTRUCTURES

CROSS-REFERENCE TO RELATED APPLICATIONS

This application claims the benefit of U.S. Provisional Application No. 61/778,716 filed on Mar. 13, 2013. The entire disclosure of the above application is incorporated herein by reference.

FIELD

The present disclosure relates to photodetectors that can achieve high responsivity using a thin film double layer heterostructures.

BACKGROUND

Today, different technologically important wavelength regimes are detected by separate photoactive semiconductors with appropriate bandgaps. For example, GaN, Si and InGaAs are typically exploited for sensing in ultraviolet, visible and near-infrared regimes, respectively. Detection of mid-infrared photons generally relies on small-bandgap semiconductor compounds such as HgCdTe, PbS or PbSe, while thermal sensing techniques are utilized for detection in far-infrared regime. In contrast, graphene is a promising optoelectronic material for ultra-broadband photodetectors due to its gapless band structure. The difficulty with utilizing graphene in standard photodetector structures is that the lifetime of photo-generated carriers is very short; it is thus necessary to separate the electrons and holes on a sub-picosecond time scale in order to efficiently generate a photocurrent and avoid simple heating of the graphene layer. So far, nearly all graphene-based photodetectors focus on exploiting graphene-metal junctions or graphene p-n junctions for extracting photocurrent. Unfortunately, these sensing schemes suffer from a small area of the effective junction region contributing to the photocurrent, along with weak optical absorption; the responsivity is thus limited to a few mA/W. Integrating graphene with plasmonic nanostructures or microcavities can enhance the light-graphene interaction and improve responsivity to tens of mA/W; however, the enhancement can only be achieved at the designed resonant frequencies, restricting their applications for broadband photodetection. In this regard, the idea of silicon waveguide-integrated graphene photodetectors was proposed recently, showing broadband photodetection with the enhanced responsivity to tens of mA/W. Photoresponsivity above 0.1 A/W can also be achieved in transition metal dichalcogenide/graphene stacks by exploiting the strong light-matter interaction. Band structure engineering in graphene has also recently been explored for photoresponsivity enhancement, but efficient photodetection can only be achieved below about 150 K due to the short electron life time in midgap states at elevated temperatures.

An alternative approach is to exploit photoconductive gain in graphene. Although graphene is conventionally regarded as a poor photoconductor owing to its ultrafast hot carrier recombination, recent studies demonstrated that hybridized graphene/quantum-dot photodetectors can achieve high photoconductive gain. This sensitive detection scheme is attributed to a strong photo-gating effect induced by trapped photocarriers in the quantum dots. Despite the excellent device responsivity, light absorption relies on the quantum dots instead of graphene, thus restricting the spectral range of photodetection.

In this disclosure, a graphene-based ultra-broadband photodetector is presented. In contrast to conventional phototransistors as well as lateral graphene devices, hot electrons and holes are separated in the proposed structure by selective quantum tunnelling into opposite graphene layers, thereby minimizing hot carrier recombination. The trapped charges on the top graphene layer can result in a strong photo-gating effect on the bottom graphene channel layer, yielding an unprecedented photo-responsivity over an ultra-broad spectral range. Furthermore, by engineering the proper tunnel barrier, prototype devices achieving ultra-broadband photodetection and a room temperature mid-infrared responsivity comparable with the state-of-the-art infrared photodetectors operating at low temperature are demonstrated.

This section provides background information related to the present disclosure which is not necessarily prior art.

SUMMARY

This section provides a general summary of the disclosure, and is not a comprehensive disclosure of its full scope or all of its features.

A photodetector is provided with a thin film double layer heterostructure. The photodetector is comprised of: a substrate; a channel layer of a transistor deposited onto a top surface of the substrate; a source layer of the transistor deposited on the top surface of the substrate; a drain layer of the transistor deposited on the top surface of the substrate, the source layer and the drain layer disposed on opposing sides of the channel layer; a barrier layer deposited onto the channel layer; and a light absorbing layer deposited on the barrier layer. The light absorbing layer is configured to absorb light and, in response to light incident on the light absorbing layer, change electrical conductance of the channel layer through hot carrier tunneling from the light absorbing layer to the channel layer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1A:
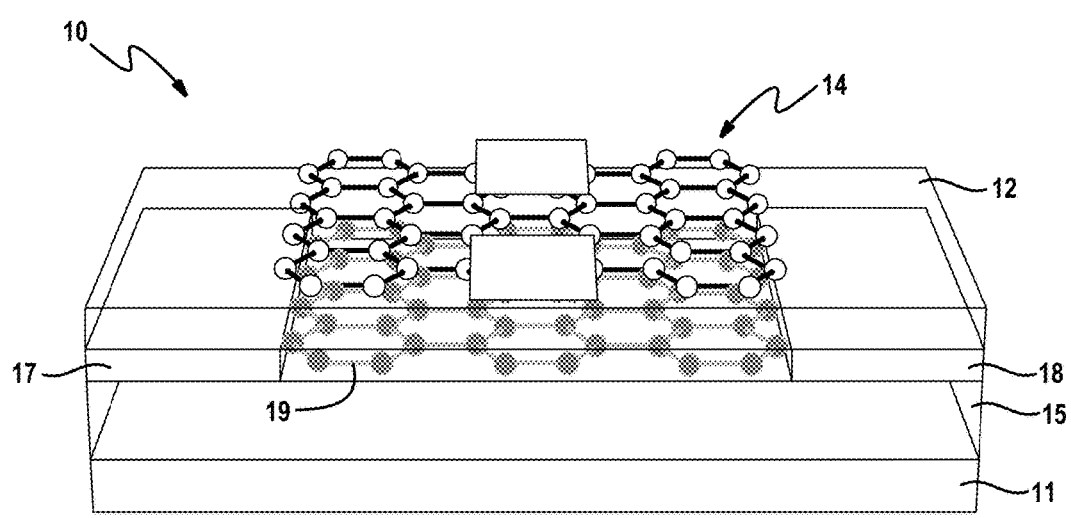
FIG. 1A is a perspective view of a photodetector having an example double-layer heterostructure.
Figure 1B:
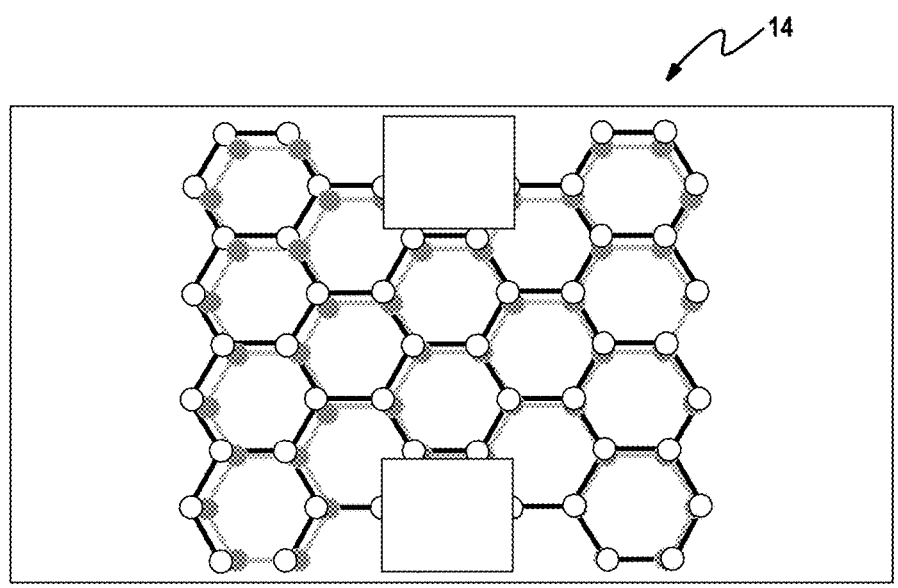
FIG. 1B is a top view of a photodetector having an example double-layer heterostructure.
Figure 1C:
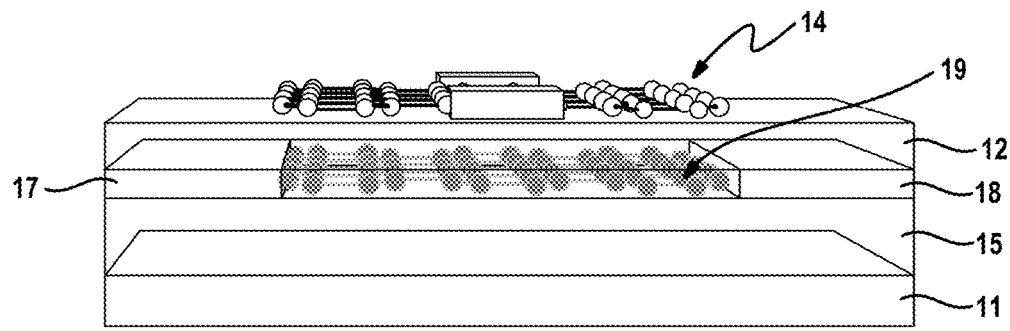
FIG. 1C is a side view a photodetector having an example double-layer heterostructure.

FIGS. 1A-1C illustrate a photodetector 10 having an example double-layer heterostructure. The photodetector 10 is comprised generally of a thin barrier layer 12 disposed on surface of a channel layer 19 of a transistor 16 and covered by a light absorbing layer 14 deposited on top of the barrier layer 12. In an example embodiment, the transistor 16 is constructed on a substrate 15 comprised, for example of silicon dioxide. More specifically, a source layer 17, a drain layer 18 and a channel layer 19 are deposited on a top surface of the substrate, such that the source layer and the drain layer are disposed on opposing sides of the channel layer. A gate layer 11 may be disposed on a bottom surface of the substrate, where the gate layer is formed, for example of silicon. Other arrangements for the transistor are also contemplated within the broader aspects of this disclosure.

The double-layer heterostructure is formed by the thin barrier layer 12 sandwiched between the light absorbing layer 14 and the channel layer 19. In an example embodiment, the light absorbing layer 14 and the channel layer 19 are comprised of graphene; whereas, the barrier layer 12 is comprised of tantalum pentoxide. The barrier layer 12 is in direct contact with light absorbing layer 14 and the channel layer 19. The graphene films used in this example embodiment were grown by chemical vapour deposition (CVD) on copper foil and then transferred onto Si/SiO$_2$ substrate. The single-layer nature of the graphene films was confirmed by Raman spectroscopy. To fabricate graphene/Ta$_2$O$_5$/graphene heterostructures, a graphene film was first transferred onto a degenerately p-doped silicon wafer with 285 nm thermal oxide. Photolithography, graphene plasma etching, and metal lift-off processes were used to fabricate the bottom graphene layer 19. The sample was then covered by a 5-nm-thick Ta$_2$O$_5$ film as the tunnel barrier 12, blanket deposited by RF sputtering. Finally, the top graphene layer 14 was transferred on top of the Ta$_2$O$_5$ thin film, and subsequent photolithography, graphene etching, and metal lift-off processes were used to fabricate the top graphene layer 14. In the example embodiment, the top graphene layer covers only a portion of the barrier layer that aligns with the channel layer as shown. In other embodiments, the top grapheme layer may cover a smaller or larger portion of the barrier layer. In other embodiments, the light absorbing layer 14 and the channel layer 19 may be comprised of different materials. Alternatively, the light absorbing layer 14 may be comprised of few-layer transition metal chalcogenides (e.g. molybdenum disulfide), a quantum dot material, various polymers or other types of light absorbing materials. The barrier layer 12 may be comprised of aluminum oxide, other types of semiconductor materials or other types of insulating materials. The channel layer 19 may be of few-layer transition metal chalcogenides (e.g., molybdenum disulfide), silicon or other types of materials know for constructing transistors.

Figure 2:
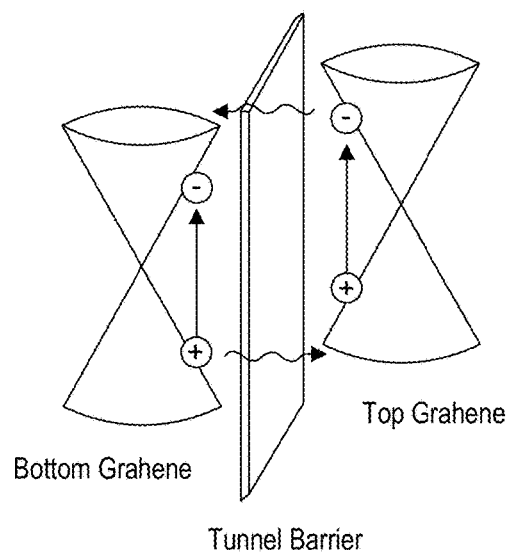
FIG. 2 is a schematic of a band diagram and photo-excited hot carrier transport under light illumination.
Figure 3:
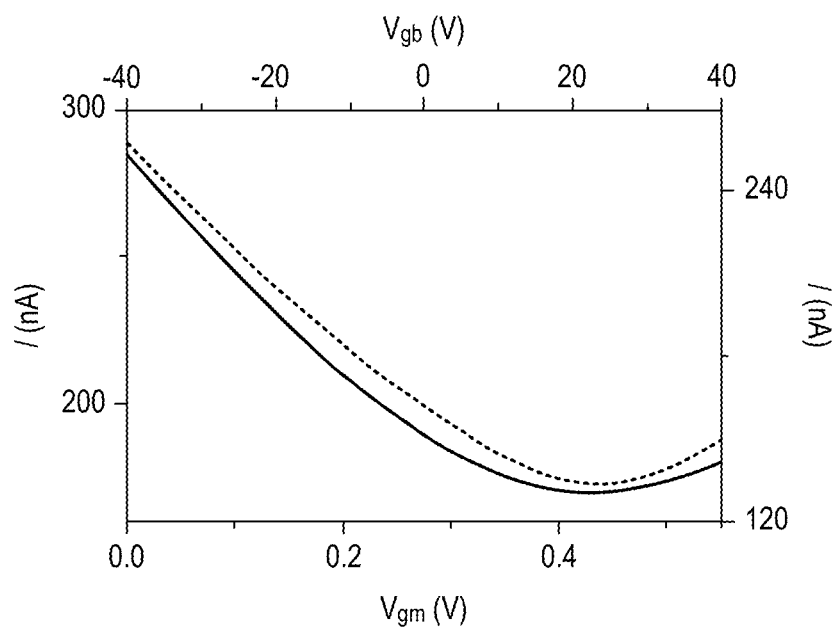
FIG. 3 is a graph depicting a transfer curve for bottom graphene layer using a silicon backgate and a transfer curve for top graphene layer using the bottom graphene layer as the gate.
Figure 4:
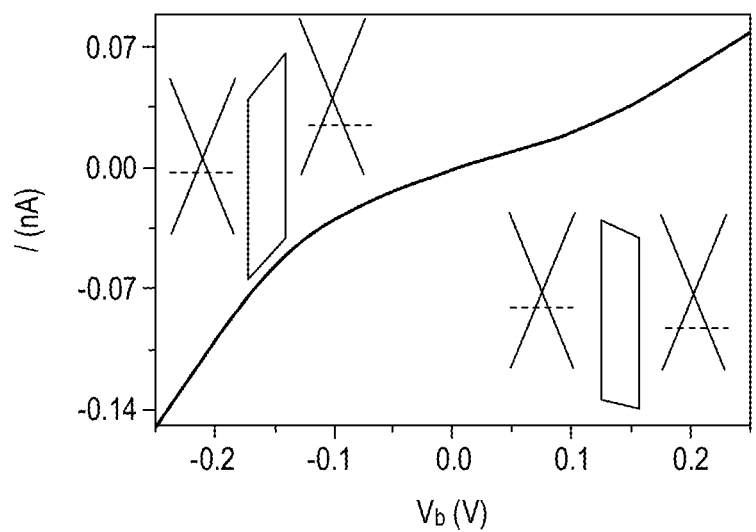
FIG. 4 is a graph depicting a vertical tunneling current as a function of bias voltage applied across two graphene layers.

The working principle of the graphene double-layer heterostructure photodetector can be understood through the band diagram as shown in FIG. 2. The device is composed of two graphene layers sandwiching a thin tunnel barrier, in this case 5-nm-thick Ta$_2$O$_5$. Here graphene functions not only as the charge transport channel but also as the light absorber. The intrinsic doping level and the Fermi energy of the bottom graphene layer can be readily determined by the backgate voltage (V$_{gb}$) dependent transfer curve shown in FIG. 3. In order to determine the Fermi energy of the top graphene layer, the bottom graphene layer can operate as a gate (V$_{gm}$), and measure its gate effect on the top graphene layer as shown in FIG. 3. The top graphene layer was found to be more heavily p-doped relative to the bottom graphene layer, with an average Fermi energy difference of 0.12 eV. Therefore, the energy band of the tunnelling barrier is tilted toward bottom graphene layer in order to equilibrate the Fermi level as shown in FIG. 4. Critically, these two closely-spaced graphene layers are electrically isolated, with an interlayer resistance >4 GΩ. The tunnelling dark current can be measured by applying a bias voltage across the graphene double layer, as shown in FIG. 4. The I-V characteristics show a larger magnitude of tunnelling current in the negative bias region than the positive bias region, also in agreement with the asymmetry of the tunnel barrier depicted in FIG. 3.

For typical photodetection operation, the potential of the top graphene layer is floated while the light-induced conductance change of the bottom graphene layer is measured in the bottom graphene layer transistor. Under light illumination, photo-excited hot carriers can tunnel efficiently into the nearby graphene layer. Most importantly, the asymmetric tunnelling barrier favours hot electrons tunnelling from the top to the bottom graphene layer. As a result, positive charges accumulate in the top graphene layer, leading to a photo-gating effect on the bottom graphene transistor. In particular, the graphene channel has high carrier mobility and is very sensitive to external electrostatic perturbation; the thin oxide film in this device design not only favours hot carrier tunnelling, but also induces high interlayer dielectric capacitance. All these factors contribute to a strong photo-gating effect and lead to efficient photon detection.

Figure 5A:
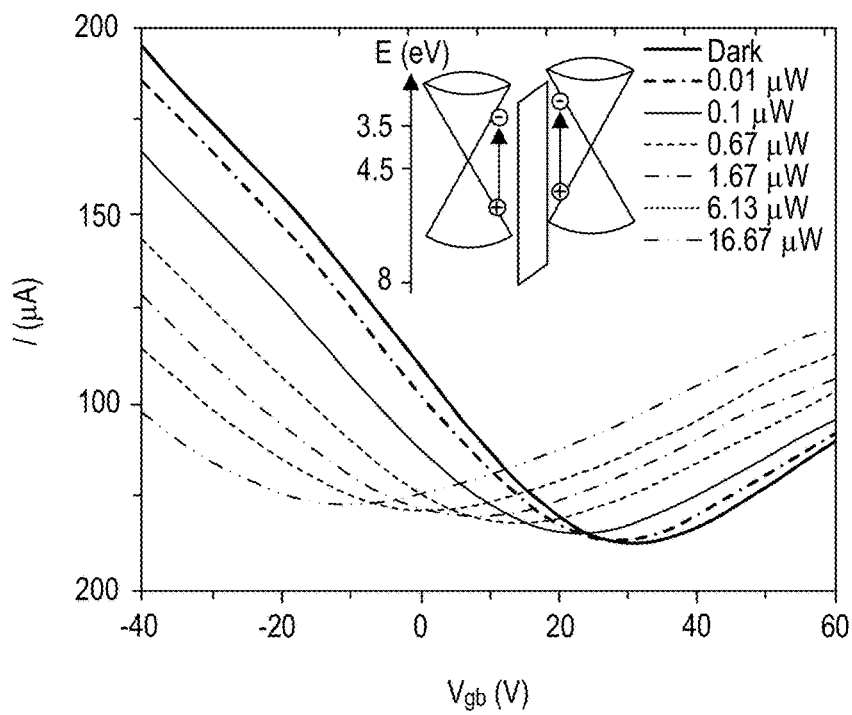
FIG. 5A is a graph depicting I-Vgb characteristics of the measured graphene photodetector under different laser powers.

To confirm the above mechanism, attention is drawn to the photoresponse of the graphene photodetector. FIG. 5A shows the effect of light illumination (continuous wave, λ=532 nm) on the gate response of the bottom graphene transistor, over four orders of magnitude optical power. Interestingly, the transfer curve shifts dramatically toward negative ($V_{gb}$) with increasing laser power, and the Dirac point voltage shift of 40 V is observed (as seen in inset of FIG. 5C). This observation supports the proposed detection mechanism, i.e., efficient tunnelling of high-energy hot electrons leads to positive charge build-up in the top graphene layer, giving rise to strong photogating effect and n-doping of the bottom graphene channel. The net photocurrent can be obtained by subtracting the dark current from the light current ($I_{light}-I_{dark}$), and is plotted in FIG. 5B. It is clear that the magnitude of photocurrent increases with excitation power. More importantly, the photocurrent signal can be gate-modulated, offering convenient on-off switching control for photodetection.

The noise properties in this device design are determined mainly by the dark current in the conducting channel. The frequency dependent noise spectral density of the photodetector is measured under 1V bias, and found that a room temperature noise equivalent power (NEP) of ~1×10$^{-11}$ W Hz$^{-1/2}$ at 1 Hz is achieved in the proof-of-concept device.

Figure 5B:
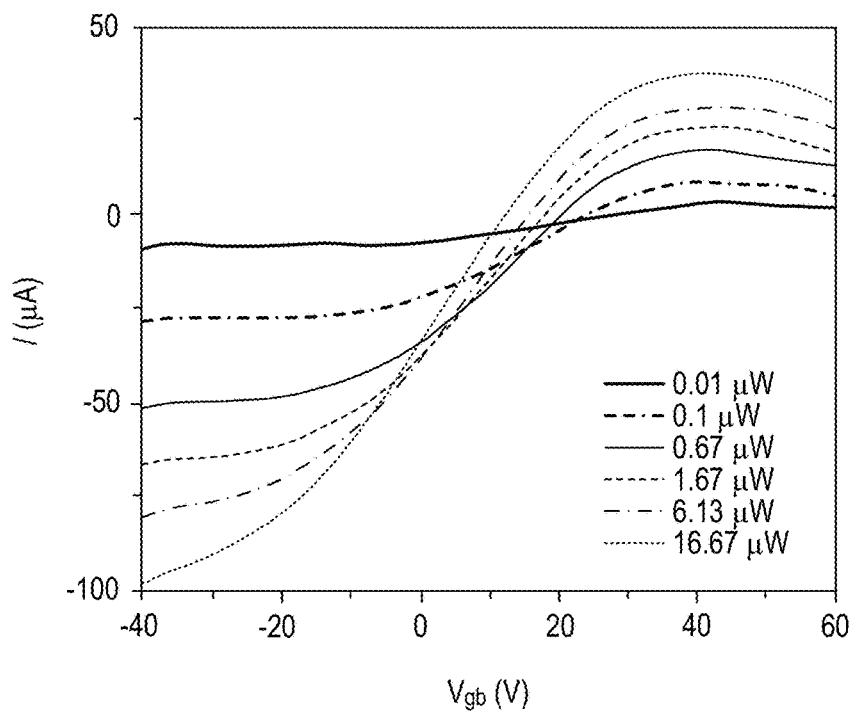
FIG. 5B is a graph depicting gate dependences of photocurrent under different laser powers.
Figure 5C:
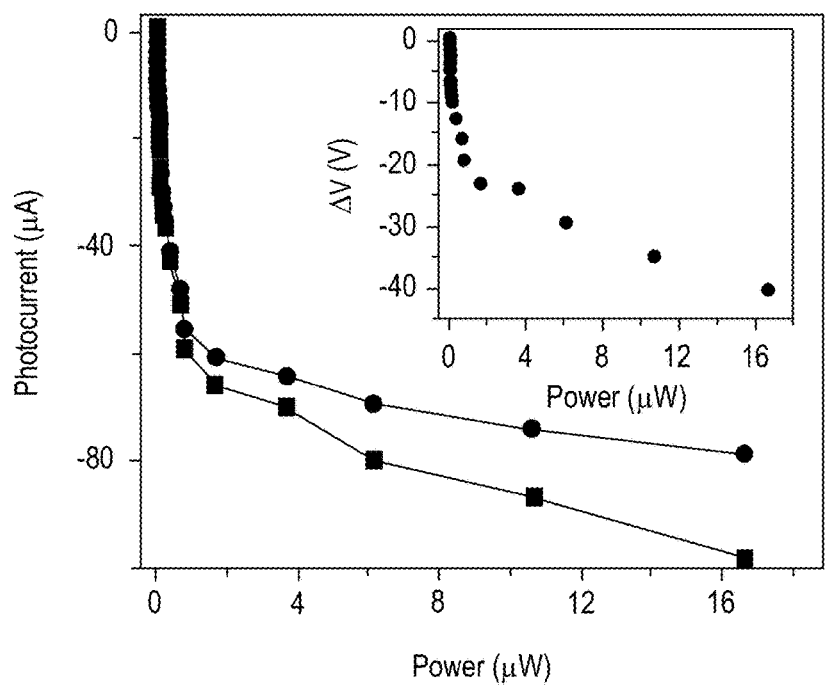
FIG. 5C is a graph depicting power dependence of photocurrent at −40V and −20V backgate voltages.
Figure 5D:
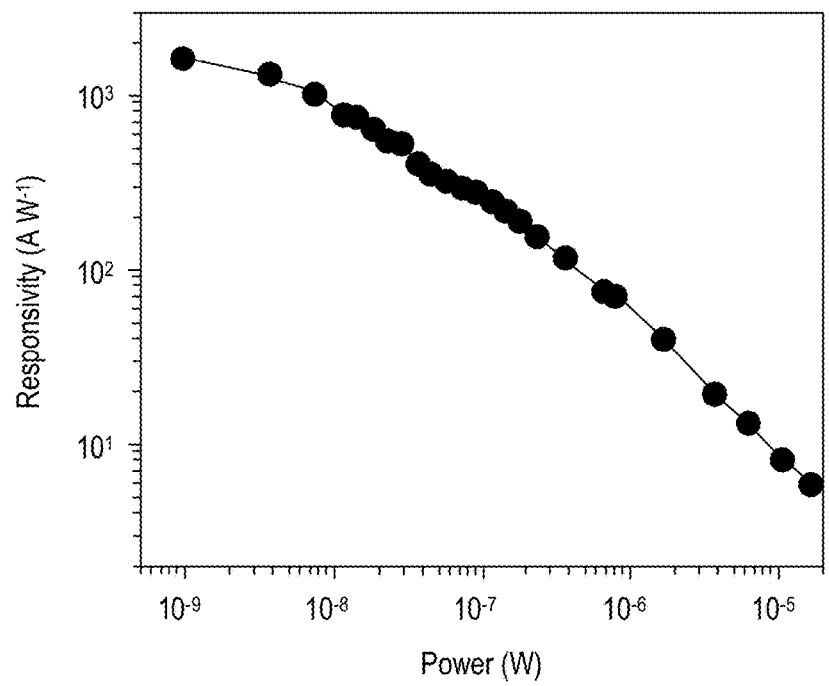
FIG. 5D is a graph depicting measured photoresponsivity versus illumination power.
Figure 5E:
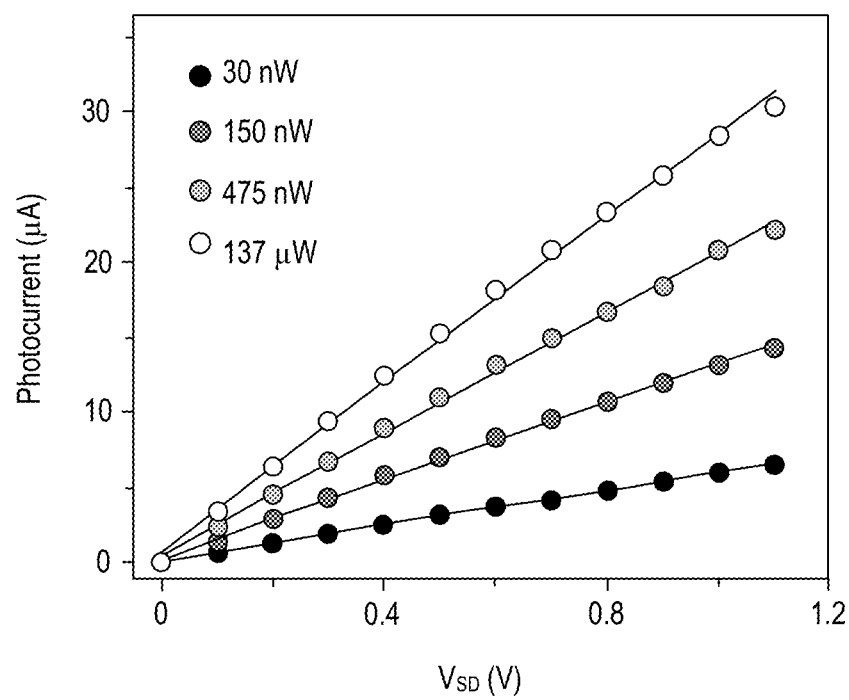
FIG. 5E is a graph depicting magnitude of the photo current increases linearly with source-drain bias voltage of the bottom graphene layer transistor.
Figure 5F:
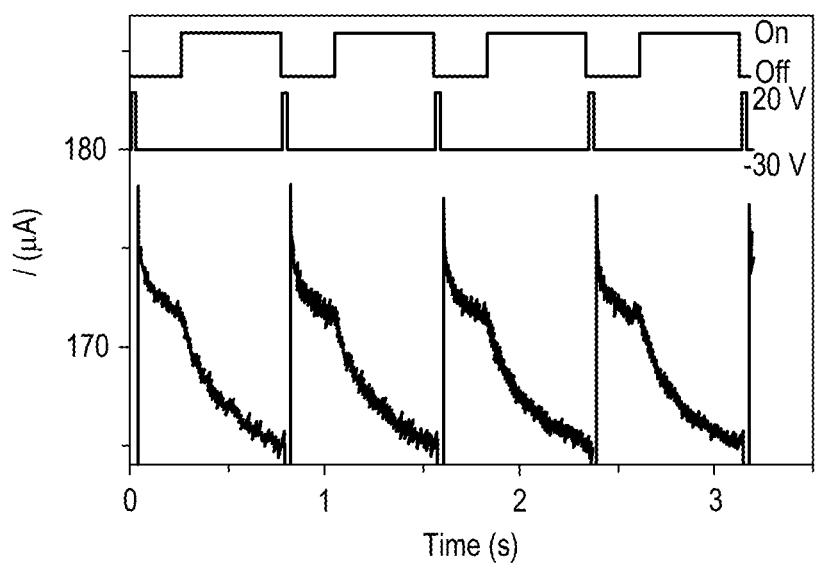
FIG. 5F is a graph depicting temporal photoresponse of the graphene photodetector.

To gain further insight into the characteristics of this photodetector, the power dependence of the current is extracted as shown in FIG. 5B, and the responsivity of the device is calculated as shown in FIG. 5D. Under low excitation power, the device shows a remarkable responsivity of greater than 1000 AW$^{-1}$ at 1 V source-drain bias voltage (VSD), suggesting the built-in amplification mechanism can efficiently convert the photon energy into a large electrical signal. In addition, the photo-induced current also shows a linear dependence on the bias voltage as seen in FIG. 5E, suggesting higher responsivity can be readily achieved by applying a larger bias voltage. The time-dependent photo-induced current measurement under on/off light modulation was also performed with 1 V bias voltage at room temperature as seen in FIG. 5F. A reset gate voltage pulse of 10 millisecond was used for fast switching, and a current modulation of 7 μA was clearly evident. It is noted that the speed of our proof-of-concept devices is limited at 10 to 1000 Hz, likely due to charge trap states in the sputtered tunnelling barrier. Because the fundamental hot carrier tunnelling rate is less than a picosecond, a significant improvement may be obtained with better dielectric quality.

Figure 6A:
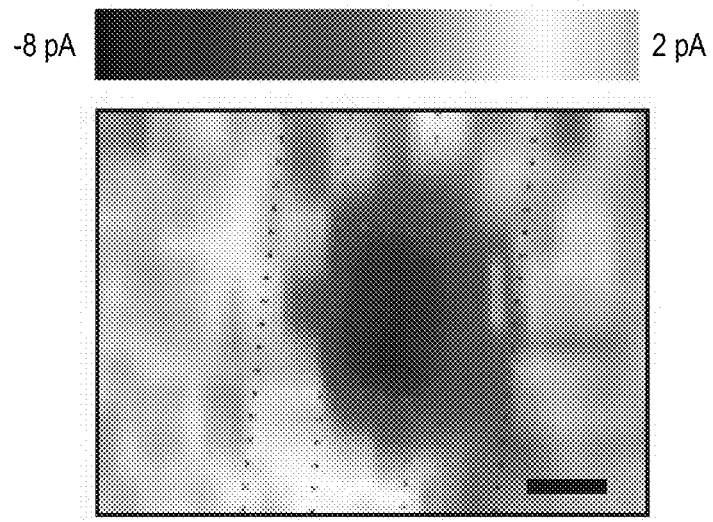
FIGS. 6A and 6B are scanning photocurrent images of the graphene double-layer heterostructures at excitation wavelengths of 900 nm and 800 nm, respectively.
Figure 6B:
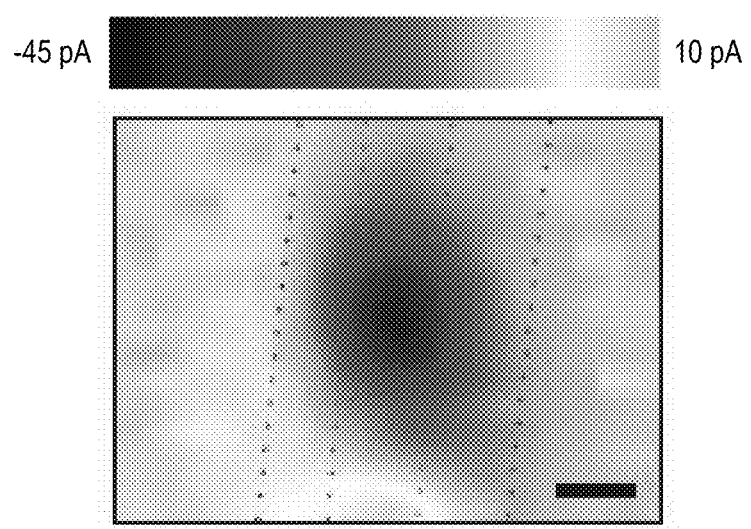

To further confirm the hot carrier tunnelling mechanism, scanning photocurrent spectroscopy was performed and the hot carrier tunnelling current across graphene layers was directly measured. The tunnelling current due to photo-excitation was measured under the short-circuit condition with the bottom graphene layer grounded. FIG. 6A shows a scanning photocurrent image of the device under continuous wave laser excitation at 900 nm. The result clearly shows that photocurrent is generated within the overlapped region of two graphene layers instead of at the graphene-metal junctions, suggesting the charge separation arises from hot carrier tunnelling and not at the graphene/metal junctions as in conventional graphene detectors. Additionally, the photocurrent polarity is negative, providing direct evidence that the asymmetry of the tunnel barrier facilitates hot electron transport from the top to the bottom graphene layer. Furthermore, we measured the same device with the shorter irradiation wavelength at 800 nm. A scanning photocurrent map shows qualitatively similar features but nearly six times larger photocurrent compared with 900 nm excitation at the same laser intensity in FIG. 6B. The dependence of photocurrent on photon energy provides further support for hot carrier tunnelling, since carriers excited to higher energies should have a higher injection rate through the barrier. It is also emphasized that the direct photocarrier tunnelling current between the two graphene layers is 7 orders of magnitude smaller than the photogating effect shown in FIG. 5 (10 pA versus 100 μA). This result further highlights the advantage of utilizing the photogating effect of the top graphene layer for high responsivity photodetection.

Figure 7A:
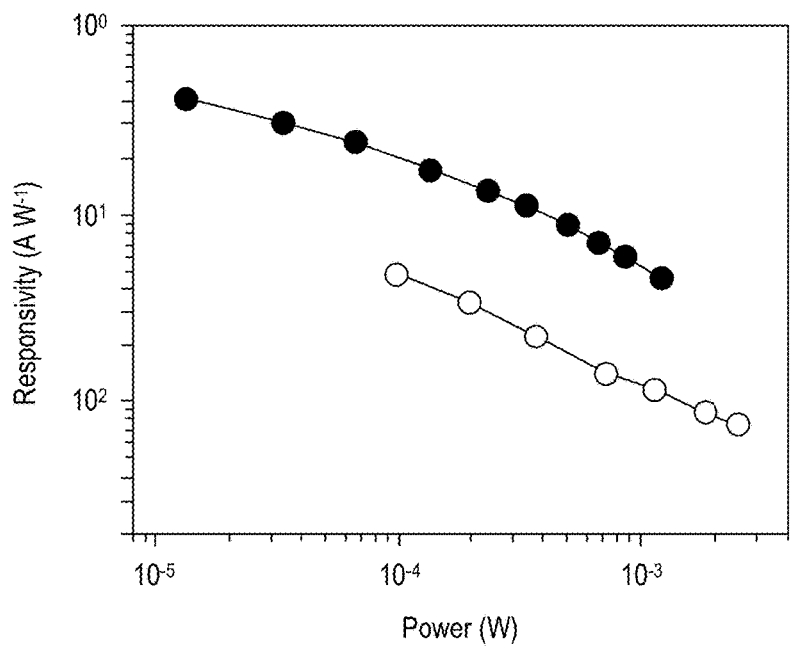
FIG. 7A is a graph depicting responsivity comparison of graphene photodetector at wavelengths of 800 nm and 900 nm.
Figure 7B:
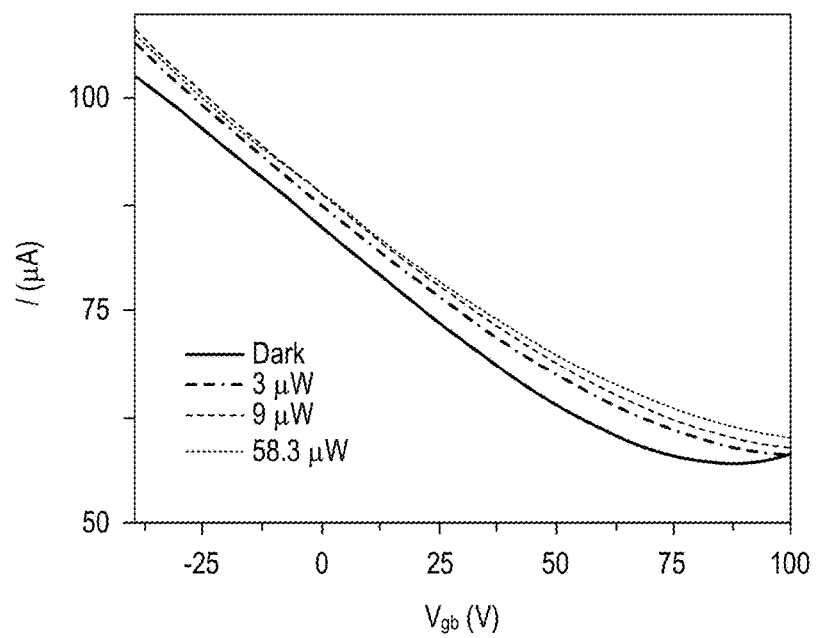
FIG. 7B is a graph depicting photoresponse of a similar control device without the top graphene layer.

The measured wavelength dependent photo-responsivities of the graphene photodetector further support the concept that the responsivity is directly related to the photon energy dependence of the hot carrier tunnelling rate. As shown in FIG. 7A, photo-responsivities of the graphene photodetector at 800 nm are also about 6 times greater than at 900 nm, suggesting that the device responsivity is closely related to hot carrier injection rate. As control experiments, we also measured the photoresponse of a graphene transistor covered by 5-nm-thick $Ta_2O_5$ but without the top graphene layer. As shown in FIG. 7B, the transfer curve shifts are much smaller and, most importantly, in the opposite direction when compared with the photoresponse of graphene double-layer photodetector (see FIG. 5A). This striking difference reveals the central role of the top graphene layer for both light absorption and photo-gating.

Figure 8A:
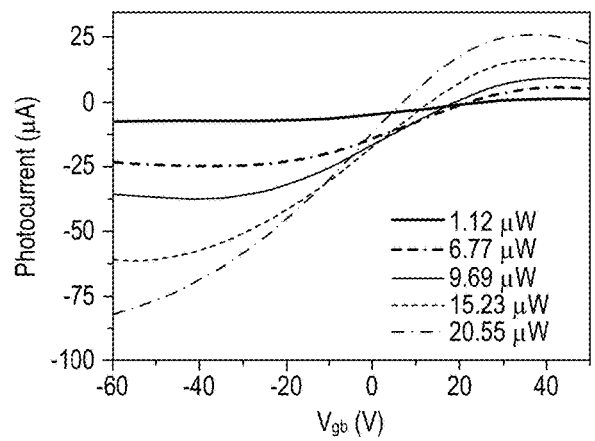
FIGS. 8A-8C are graphs depicting gate dependence of photocurrent under different illumination powers with excitation wavelengths at 1.3 μm, 2.1 μm and 3.2 μm, respectively.
Figure 8B:
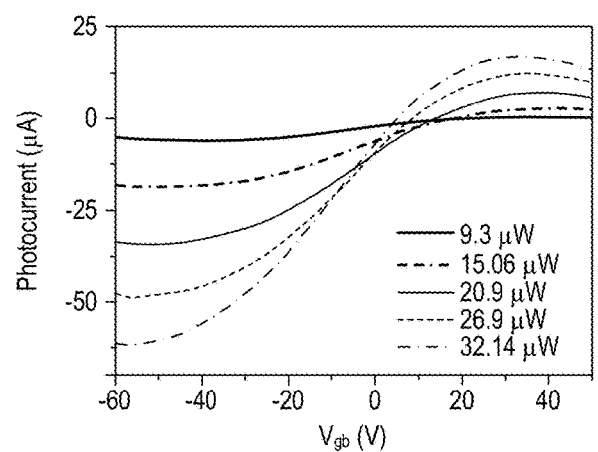
Figure 8C:
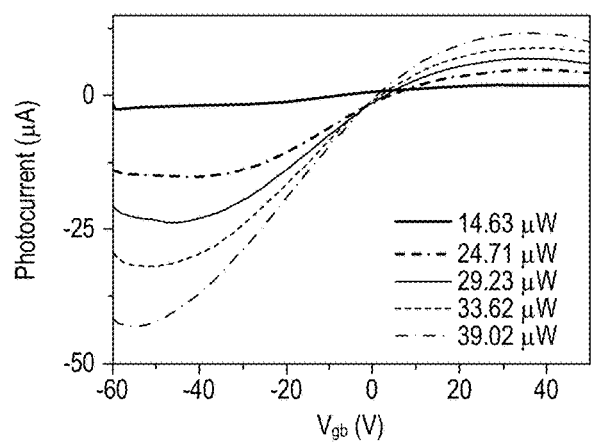
Figure 9A:
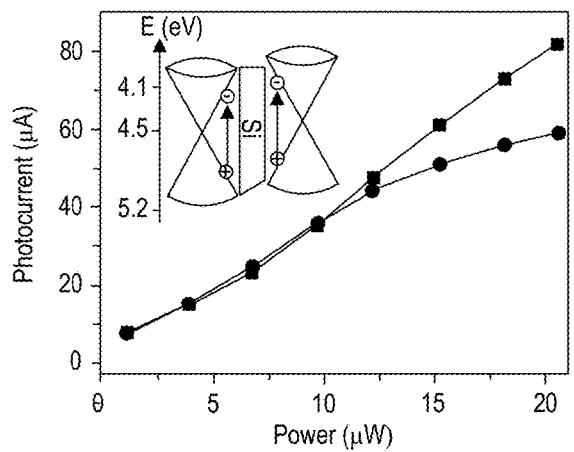
FIGS. 9A-9C are graphs depicting photocurrent versus illumination power under excitation wavelengths of 1.3 μm, 2.1 μm and 3.2 μm, respectively.
Figure 9B:
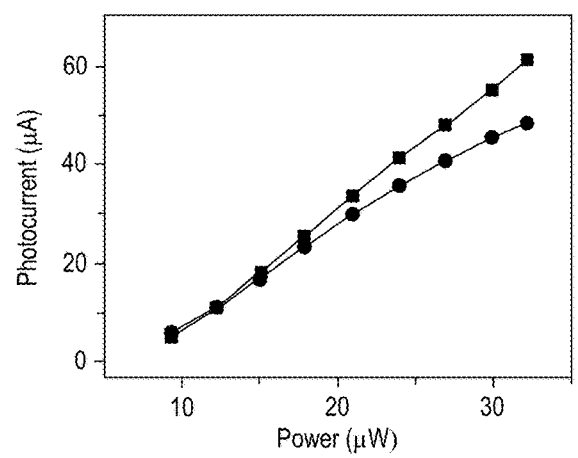
Figure 9C:
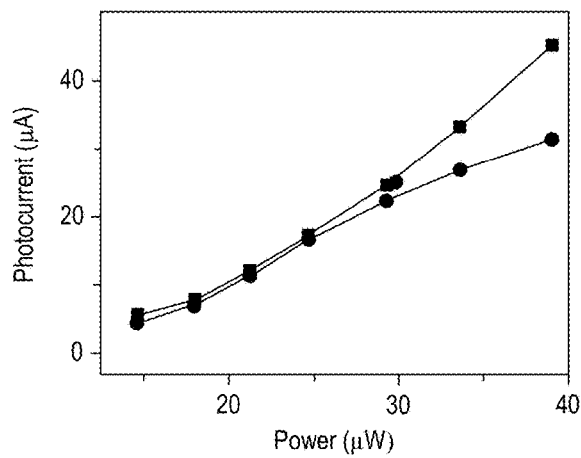

The tunnel barrier height is a key parameter affecting device operation. To extend the range of high responsivity photodetection into the infrared regime, we fabricated similar device structures, but incorporated intrinsic silicon as the tunnel barrier, in place of the wide bandgap $Ta_2O_5$ layer. The silicon conduction band is ~0.5 eV above the Fermi level of intrinsic graphene (see inset of FIG. 9A), enabling tunnelling of lower energy electrons. The infrared photoresponse of the graphene/silicon/graphene heterostructures are similar to previous measurements, displaying large shifts of the transfer curve and Dirac point voltage toward negative $V_{gb}$ with increasing illumination power. FIG. 8A-8C shows the extracted gate dependence of photocurrent under 1.3 μm, 2.1 μm and 3.2 μm wavelength light illumination, respectively. The strong photogating effect and gate modulation of photosignal are again clearly observed in both near-infrared and mid-infrared regimes. Power-dependent photocurrent curves were extracted from FIGS. 8A-8C and are plotted in FIGS. 9A-9C, respectively. Significantly, the near-infrared responsivity of the device reaches 4 AW$^{-1}$ at λ=1.3 μm (FIG. 8B) and 1.9 AW$^{-1}$ at λ=2.1 μm (FIG. 9B) at room temperature. These values are more than three orders of magnitude higher than the responsivity of graphene/$Ta_2O_5$/graphene heterostructures at the near-infrared wavelengths. Furthermore, our prototype graphene photodetector exhibits room temperature mid-infrared responsivity of 1.1 AW$^{-1}$ at λ=3.2 μm (FIG. 9C), rivaling state-of-art mid-infrared detectors without the need for cryogenic cooling.

In summary, hot carrier tunnelling as a mechanism for photodetection in a graphene double-layer heterostructure provides a viable route for ultra-broadband and high sensitivity photodetection at room temperature. To further enhance the device performance, the bottom graphene channel could be replaced with other thin film semiconductors to reduce the background current. Furthermore, interlayer hot carrier tunnelling and photo-gating could be enhanced by utilizing atomically thin 2D semiconductors, such as $MoS_2$ and $WS_2$, as the tunnelling barrier layer.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A photodetector, comprising:
   a substrate;
   a channel layer of a transistor deposited onto a top surface of the substrate;
   a source layer of the transistor deposited on the top surface of the substrate;
   a drain layer of the transistor deposited on the top surface of the substrate, the source layer and the drain layer disposed on opposing sides of the channel layer;
   a barrier layer deposited onto the channel layer; and
   a light absorbing layer comprised of graphene or few layer transition metal chalcogenides deposited on the barrier layer, the light absorbing layer configured to absorb light and, in response to light incident on the light absorbing layer, change electrical conductance of the channel layer through hot carrier tunneling from the light absorbing layer to the channel layer, and the barrier layer is in direct contact with and sandwiched between the light absorbing layer and the channel layer.

2. The photodetector of claim 1 wherein the barrier layer is comprised of one of tantalum pentoxide or aluminum oxide.

3. The photodetector of claim 2 wherein the channel layer is comprised of one of graphene, germanium, molybdenum disulfide or silicon.

4. The photodetector of claim 1 wherein the light absorbing layer and the channel layer are comprised of graphene.

5. The photodetector of claim 4 wherein the barrier layer is deposited onto the source layer, the drain layer and the channel layer, and the light absorbing layer is deposited onto a portion of the barrier layer that is covering the channel layer.

6. The photodetector of claim 1 further comprises a gate layer deposited onto a bottom surface of the substrate.

7. The photodetector of claim 1 wherein the gate layer is comprised of silicon.

8. The photodetector of claim 1 wherein the light absorbing layer is comprised of a material which differs from the material of the channel layer.

9. A photodetector, comprising:
   a substrate;
   a channel layer of a transistor deposited on a top surface of the substrate;
   a source region of the transistor deposited on a top surface of the substrate;
   a drain region of the transistor deposited on a top surface of the substrate, the source region and the drain region disposed on opposing sides of the channel layer;
   a barrier layer deposited on the channel layer; and
   a light absorbing layer comprised of graphene deposited on the barrier layer, such that the barrier is in direct contact with and sandwiched between the light absorbing layer and the channel layer.

10. The photodetector of claim 9 wherein the barrier layer is comprised of one of tantalum pentoxide or aluminum oxide.

11. The photodetector of claim 10 wherein the channel layer is comprised of one of graphene, germanium, molybdenum disulfide or silicon.

12. The photodetector of claim 9 wherein the light absorbing layer and the channel layer are comprised of graphene and the barrier layer is sandwiched between the light absorbing and channel layers.

13. The photodetector of claim 12 wherein the barrier layer is deposited onto the source layer, the drain layer and the channel layer, and the light absorbing layer is deposited onto a portion of the barrier layer that is covering the channel layer.

14. The photodetector of claim 9 further comprises a gate layer deposited onto a bottom surface of the substrate.

15. The photodetector of claim 9 wherein the light absorbing layer is comprised of a material which differs from the material of the channel layer.

16. A photodetector, comprising:
- a substrate;
- a channel layer of a transistor comprised of graphene and deposited onto a top surface of the substrate;
- a source layer of the transistor deposited on the top surface of the substrate;
- a drain layer of the transistor deposited on the top surface of the substrate, the source layer and the drain layer disposed on opposing sides of the channel layer;
- a barrier layer deposited onto the channel layer; and
- a light absorbing layer comprised of graphene deposited on the barrier layer such that the barrier layer is sandwiched between the light absorbing layer and the channel layer, the light absorbing layer configured to absorb light and, in response to light incident on the light absorbing layer, change electrical conductance of the channel layer through hot carrier tunneling from the light absorbing layer to the channel layer.

* * * * *